(12) United States Patent
Maggioni

(10) Patent No.: US 12,292,457 B2
(45) Date of Patent: May 6, 2025

(54) FLEXIBLE MEMBRANE ADAPTED TO CARRY HIGH-FREQUENCY (RF) POWER SIGNALS AND CORRESPONDING PROBE CARD FOR THE HIGH-FREQUENCY (RF) POWER TEST OF ELECTRONIC DEVICES

(71) Applicant: TECHNOPROBE S.P.A., Cernusco Lombardone (IT)

(72) Inventor: Flavio Maggioni, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 202 days.

(21) Appl. No.: 18/254,044

(22) PCT Filed: Nov. 18, 2021

(86) PCT No.: PCT/EP2021/082197
§ 371 (c)(1),
(2) Date: May 23, 2023

(87) PCT Pub. No.: WO2022/112100
PCT Pub. Date: Jun. 2, 2022

(65) Prior Publication Data
US 2023/0408548 A1 Dec. 21, 2023

(30) Foreign Application Priority Data

Nov. 25, 2020 (IT) .................. 102020000028370

(51) Int. Cl.
*G01R 1/067* (2006.01)
*G01R 1/073* (2006.01)
(Continued)

(52) U.S. Cl.
CPC ....... *G01R 1/0735* (2013.01); *G01R 1/06772* (2013.01); *H05K 1/147* (2013.01);
(Continued)

(58) Field of Classification Search
CPC .................... G01R 1/06772; G01R 1/0735
See application file for complete search history.

(56) References Cited

U.S. PATENT DOCUMENTS

2006/0145338 A1 7/2006 Dong
2013/0328585 A1* 12/2013 Onuma ............. G01R 1/07314
324/756.03

FOREIGN PATENT DOCUMENTS

WO 2018149838 A1 8/2018

OTHER PUBLICATIONS

International Search Report and Written Opinion for Corresponding International Application No. PCT/EP2021/082197 (9 Pages) (Feb. 24, 2022).

* cited by examiner

*Primary Examiner* — Alesa Allgood
(74) *Attorney, Agent, or Firm* — LUCAS & MERCANTI, LLP

(57) ABSTRACT

A flexible membrane adapted to carry high-frequency power signals is described having a plurality of contact pads in a central portion of the flexible membrane connected to a plurality of micro contact probes and a plurality of contact structures connected to a support plate in a peripheral portion of the flexible membrane, as well as a plurality of conductive tracks connecting the contact pads with the contact structures. The flexible membrane further includes an intermediate portion between the central and peripheral portions. The elastic membrane is divided into a first area having a first total thickness and into a second area having a second total thickness. The first area is contiguous and adjacent to the second area. The first total thickness is less than or equal to 75 μm and the second total thickness is greater than the first total thickness.

33 Claims, 7 Drawing Sheets

(51) Int. Cl.
  *H05K 1/14* (2006.01)
  *H05K 3/32* (2006.01)
  *H05K 3/40* (2006.01)
(52) U.S. Cl.
  CPC ........... *H05K 3/326* (2013.01); *H05K 3/4007* (2013.01); *H05K 2201/0367* (2013.01)

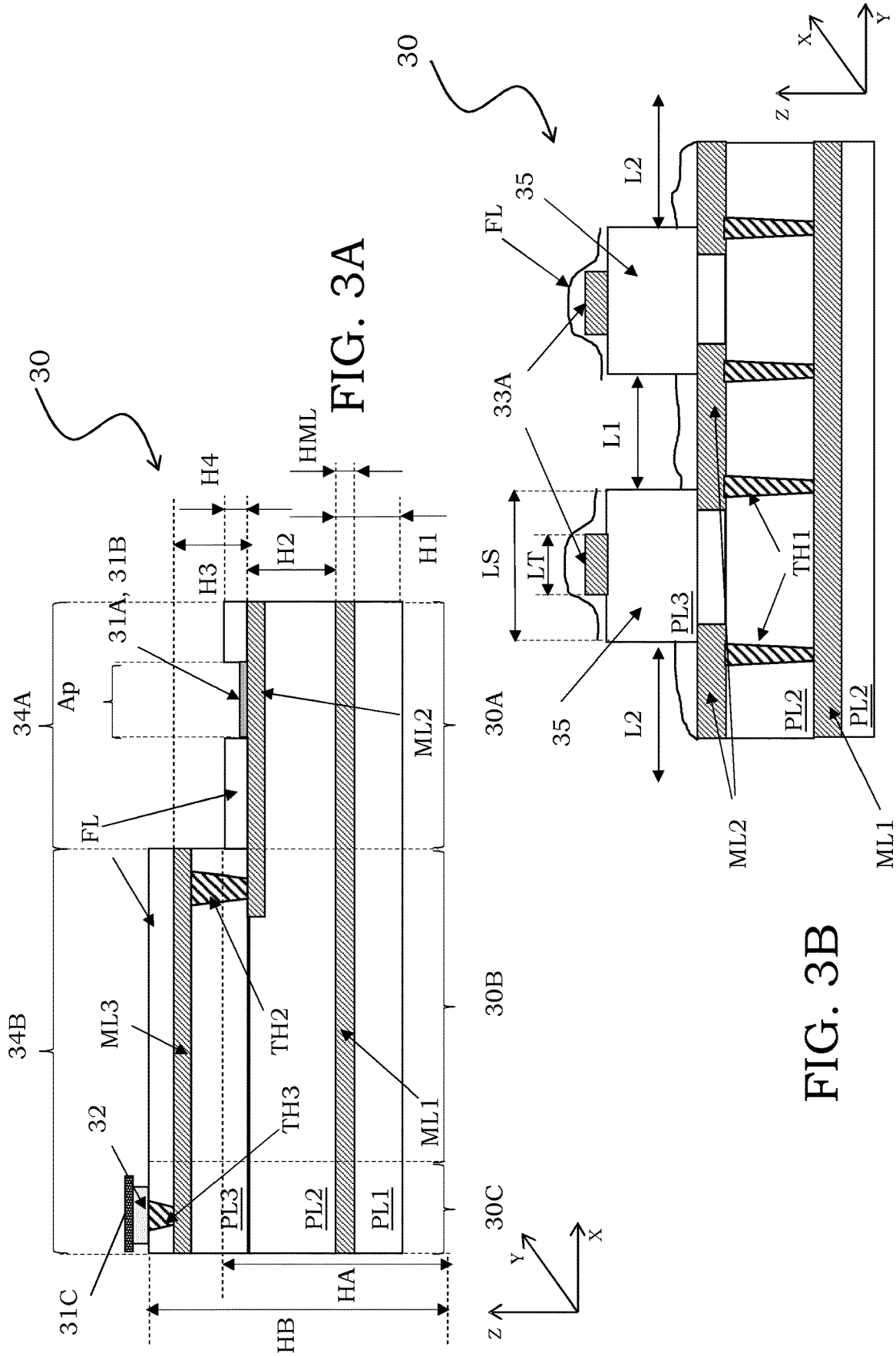

FLEXIBLE MEMBRANE ADAPTED TO CARRY HIGH-FREQUENCY (RF) POWER SIGNALS AND CORRESPONDING PROBE CARD FOR THE HIGH-FREQUENCY (RF) POWER TEST OF ELECTRONIC DEVICES

CROSS-REFERENCE TO RELATED APPLICATIONS

This application is a 371 of PCT/EP2021/082197, filed Nov. 18, 2021, which claims the benefit of Italian Patent Application No. 102020000028370, filed Nov. 25, 2020.

TECHNICAL FIELD

The present invention relates to a flexible membrane adapted to carry high-frequency power signals.

More particularly, the present invention relates to a flexible membrane comprising a plurality of contact pads adapted to electrically connect with a plurality of micro contact probes and made in a central portion thereof and a plurality of contact structures adapted to electrically connect with a support plate and made in a peripheral portion thereof, as well as a plurality of conductive tracks, each of them electrically connecting one of the contact pads with one of the contact structures, the flexible membrane further comprising an intermediate portion arranged and connected between the central portion and the peripheral portion.

The present invention also relates to a probe card comprising such a flexible membrane.

The following description is made with reference to this field of application, with the only purpose of simplifying the exposition thereof.

BACKGROUND OF THE INVENTION

As it is well known, a probe card is essentially a device adapted to electrically connect a plurality of contact pads of a microstructure, in particular an electronic device integrated on a semiconductor wafer, with corresponding channels of a testing apparatus which performs the functionality testing thereof, particularly the electric one, or generically the test.

The test performed on integrated circuits serves in particular to detect and isolate defective circuits as early as in the production phase. Typically, the probe cards are thus used for the electric test of the circuits integrated on wafers before cutting and assembling them inside a chip containment package.

A probe card usually comprises a plurality of contact probes formed by conductive wires of special alloys with good electrical and mechanical properties which allow suitable pads made on the device under test to contact further pads made on an interface card with the testing apparatus, so as to allow signals to be carried from and towards this device under test.

For high-frequency applications, the overall length of the contact probes should be considerably reduced, in particular below 5000 µm, so as to limit the well-known self-inductance phenomenon, enhanced in the case of high-frequency signals or RF signals. In particular, it is pointed out that the term "probes for high-frequency applications" means probes which are able to carry signals with frequencies of more than 1 GHz.

However, the reduced length of the body of the probes dramatically increases the stiffness thereof, which involves an increase in the force exerted by them on the contact pads of a device under test, which can result in a breaking of these pads, with irreparable damage of the device under test, a situation to be obviously avoided. Moreover, the increase in the stiffness of the contact probes due to the reduction of the length thereof also increases the risk of breaking of the probes themselves.

To remedy to these problems some solutions are known, in which the probe card comprises a flexible membrane with which a plurality of reduced-length contact probes or microprobes are associated, which are adapted to provide the mechanical and electrical contact with the contact pads of the device under test, as well as at least one damping structure associated with the membrane in correspondence of these contact probes. The membrane is suitably equipped with metal tracks which are able to connect the microprobes with contact pads of an interface card with a testing apparatus, allowing high-frequency power signals (RF) to be carried between this interface card and the device under test.

A known solution of this type is schematically illustrated in FIG. 1.

In particular, this figure shows by way of example a probe card 10 comprising at least one damping structure 17 interposed between a flexible membrane 15 and an interface or support plate 14, which is preferably a printed circuit card (PCB) which ensures the connection between the probe card 10 and the testing apparatus (not illustrated).

Suitably, the flexible membrane 15 comprises a first portion or central portion 15A, a second portion or intermediate portion 15B and a third portion or peripheral portion 15C. More particularly, the central portion 15A is intended to contact the damping structure 17 and the peripheral portion 15C is intended to contact the support plate 14, while the intermediate portion 15B is a portion intended to deform, in particular to lengthen and shorten, following the movement of a device under test 12 integrated on a semiconductor wafer 11 in contact with the central portion 15A during the testing operations of the device itself.

The probe card 10 further comprises a plurality of micro contact probes 16 arranged on a first face F1 of the flexible membrane 15, in particular made at the central portion 15A thereof, this first face F1 being a lower face of the flexible membrane 15 according to the local reference of FIG. 1.

The micro contact probes 16 are adapted to contact the contact pads 12A of the device under test 12 and are made of a conductive material selected for example from platinum, rhodium, palladium, silver, copper or an alloy thereof, preferably a platinum alloy.

Suitably, particularly in the case of high-frequency applications, the micro contact probes 16 have a reduced height, for example a height of less than at least 200 µm, generally comprised between 10 µm and 200 µm, height meaning a dimension of these probes measured in a direction which is orthogonal to the device under test 12, that is along the axis Z of the local reference system indicated in the figure. In the known solutions on the market, these micro contact probes 16 are made as pyramids directly grown on the flexible membrane 15 by means of photolithographic processes.

Furthermore, the damping structure 17 abuts onto a second face F2 of the flexible membrane 15, opposed to the first face F1, positioned in correspondence of the central portion 15A of this flexible membrane 15, that is in correspondence of the portion equipped with the micro contact probes 16 and thus corresponding to an area of the wafer 11 comprising contact pads 12A of the device under test 12 integrated thereon. Thereby, the damping structure 17 forms an abutting element for the flexible membrane 15 in this central portion 15A and allows it to be retained in the direction of the axis Z during the pressing contact of the micro contact probes 16 onto the contact pads 12A of the device under test 12.

This damping structure 17 also acts as a damping element for the micro contact probes 16, adjusting the contact force thereof on the contact pads 12A of the device under test 12. Suitably, the damping structure 17 can be also made with materials adapted to maximise the damping effect for the micro contact probes 25 and to ensure a flatness of the central portion 15A of the membrane 15 during the contact with the device under test 12.

The flexible membrane 15 further comprises conductive tracks 13 adapted to carry signals from the micro contact probes 16 towards the support plate 14 and suitably connected thereto. The conductive tracks 13 can be made on a surface of the membrane 15, in particular the second face F2 or upper face thereof according to the local reference of the figure or inside the membrane itself and extend from the central portion 15A of this flexible membrane 15, in correspondence of a corresponding micro contact probe 16 to which they are connected, along the intermediate portion 15B of this flexible membrane 15, so as to be connected to the contact pads 14A of the support plate 14 at the peripheral portion 15C of the membrane 15.

It is also possible to make the damping structure 17 by means of a structure corresponding to a probe head equipped with a body which houses a plurality of contact probes extended between the interface card of the testing apparatus and the flexible membrane 15, in particular adapted to abut onto the second face F2 of the flexible membrane 15. These contact probes are actually insulated from the conductive tracks 13 made in the flexible membrane 15, the signals being carried by the micro contact probes 16.

The need to ensure a controlled impedance value for these conductive tracks 13 is well known in the case of high-frequency applications or RF applications, which constrains the width values of these conductive tracks 13 as a function of the thickness of the flexible membrane 15 on which they are made, typically formed of polyamide.

In current RF applications, these conductive tracks 13 are made by means of copper tracks with the thickness of 10-15 µm and a width of 50 µm on a polyamide flexible membrane 15 with the thickness of 25 µm, which ensures a controlled impedance at 50Ω. These conductive tracks 13 further have a length which can also attain a length of some centimetres to reach the interface card 14 towards the testing apparatus. In particular, based on the local reference indicated in FIG. 1, the thickness indicates the dimension of a conductive track 13 along the axis Z, the width the dimension thereof along the axis Y and the length thereof the one along the axis X.

Conductive tracks 13 with the above-indicated dimensions are able to properly operate with low-and-medium-power RF applications, but they prove to be ineffective in the case of RF power applications, that is with values of more than 35 dBm. In that case, in fact, the usual copper conductive tracks can reach temperatures of 600° C., which causes the fusion of the conductive tracks themselves.

The technical problem of the present invention is thus to provide a flexible membrane which is able to carry high-frequency (RF) and high-power signals in conductive tracks made therein and a corresponding probe card comprising this membrane for contacting a plurality of micro contact probes adapted to carry power signals so as to ensure a proper operation of the card in the test of electronic devices integrated in RF power applications.

SUMMARY OF THE INVENTION

The solution idea underlying the present invention is to provide a flexible membrane with at least one portion with a suitably increased thickness at conductive tracks for carrying high-frequency (RF) power signals, these tracks being able to have such widths as to prevent the fusion thereof, and a portion with a reduced thickness at a contact area of the micro contact probes which is able to ensure the proper handling thereof.

Based on this solution idea the technical problem is solved by a flexible membrane adapted to carry high-frequency power signals, comprising a plurality of contact pads adapted to electrically connect with a plurality of micro contact probes and made in a central portion of the flexible membrane and a plurality of contact structures adapted to electrically connect with a support plate and made in a peripheral portion of the flexible membrane, as well as a plurality of conductive tracks made in the flexible membrane, each of the conductive tracks electrically connecting one of the contact pads with one of the contact structures, the flexible membrane further comprising an intermediate portion arranged and connected between the central portion and the peripheral portion, characterised in that it is divided into a first area having a first total thickness and into a second area having a second total thickness, the first area being contiguous and adjacent to the second area, the first total thickness having a value which is lower or equal to 75 µm and the second total thickness having a value which is greater than the value of the first total thickness and in that the first area of the membrane extends at the central portion and comprises the plurality of contact pads.

More particularly, the invention comprises the following additional and optional features, taken individually or in case in combination.

According to an aspect of the invention, the second area can comprise a plurality of rails separated by air gaps.

Furthermore, the flexible membrane can comprise a multilayer structure formed by a plurality of elastic layers and of conductive layers alternating with each other, the conductive layers comprising a plurality of conductive traces adapted to form the conductive tracks for connecting the contact pads with the contact structures, the conductive traces made in the first area having a lower width than the conductive traces made in the second area, the conductive traces with a greater width being made at the rails, if any.

The flexible membrane can also comprise conductive structures adapted to connect conductive traces made in different conductive layers.

According to another aspect of the invention, the flexible membrane can comprise a multilayer structure formed at least by a first elastic layer in which a first conductive layer is made, topped by a second elastic layer in which a second conductive layer is made, by a third elastic layer in which a third conductive layer is made and by a final elastic layer which covers the third elastic layer and the second elastic layer, where it is not topped by the third elastic layer, the third elastic layer comprising the rails, if any.

According to still another aspect of the invention, the first elastic layer, the first conductive layer and the second elastic layer can extend along the first area and the second area of the flexible membrane, and the third elastic layer and the third conductive layer can extend just along the second area, the second conductive layer comprising a first plurality of conductive traces which extend along the first area, partially penetrate in the intermediate portion of the flexible membrane and are in connection with a plurality of conductive traces made in the third conductive layer.

The second conductive layer can further comprise a second plurality of conductive traces which extend along the first area and the second area and are made in correspondence of the air gaps which separate the rails, if any.

According to another aspect of the invention, the flexible membrane can comprise first conductive connecting structures between conductive traces made in the first conductive layer and in the second conductive layer, second conductive connecting structures between conductive traces made in the second conductive layer and in the third conductive layer and third conductive connecting structures between traces made in the third conductive layer and bases protruding from the third conductive layer and electrically connected with the conductive portions of the flexible membrane.

Suitably, according to an aspect of the invention, the conductive traces made in the third conductive layer can have a greater width than the conductive traces made in the second conductive layer, preferably they can have a width of more than 50 µm.

These conductive traces can be further made in grooves arranged in the elastic layers.

According to a further aspect of the invention, the flexible membrane can comprise first conductive tracks which include a first portion formed by a conductive trace made in the second conductive layer and a second portion formed by a conductive trace with a greater width made in the third conductive layer, each first conductive track being connected to a first contact pad made in the central portion of the flexible membrane and adapted to contact a micro contact probe for carrying high-frequency power signals, that is signals with a frequency of more than 1 GHz and a power of more than 35 dBm, these first conductive tracks being made in the rails, if any.

The flexible membrane can also comprise ground lines made by means of ground conductive tracks which include a first portion formed by a trace made in the second conductive layer and a second portion formed by a trace made in the first conductive layer, interconnected by means of the conductive structures, each ground conductive track being connected to a ground pad made in the central portion of the flexible membrane, the ground conductive tracks being made at the first conductive tracks, in the rails, if any.

The ground conductive tracks can further comprise a third portion formed by a trace made in the third conductive layer, interconnected to the first portion formed by a trace made in the second conductive layer by means of additional conductive structures.

According to another aspect of the invention, the flexible membrane can comprise second conductive tracks made by conductive traces of the second conductive layer, arranged at areas of the second elastic layer which are free from rails which form the third elastic layer, if any, each second conductive track being connected to a second contact pad made in the central portion of the flexible membrane and adapted to contact a micro contact probe for carrying high-frequency non-power signals, that is signals with a frequency of more than 1 GHz and a power of less than 35 dBm.

Suitably, the first conductive tracks, the second conductive tracks and the ground conductive tracks can be further connected to conductive portions made in the peripheral portion of the flexible membrane.

Furthermore, the central portion can comprise a plurality of strips on which the contact pads of the micro contact probes are made.

According to an aspect of the invention, the flexible membrane can be made of a dielectric material, preferably polyamide and can comprise conductive tracks made of a conductive material, preferably copper.

According to another aspect of the invention, the first elastic layer, the second elastic layer and the third elastic layer can have a respective first thickness, second thickness and third thickness having values comprised between 10 µm and 30 µm, preferably 25 µm and the final elastic layer can have a fourth thickness having a value comprised between 5 µm and 15 µm, preferably 5 µm.

Furthermore, the first conductive layer, the second conductive layer and the third conductive layer can have thicknesses having values comprised between 10 µm and 15 µm, preferably 10 µm.

Finally, the first area can have a first total thickness having values comprised between 40 µm and 50 µm and the second area can have a second total thickness having values comprised between 70 µm and 125 µm.

The technical problem is also solved by a probe card for testing electronic devices, comprising at least one support plate, one flexible membrane and a plurality of micro contact probes associated with a first face of the flexible membrane, the micro contact probes being adapted to abut onto a plurality of contact pads of a device under test and being electrically coupled to a plurality of conductive tracks made in the flexible membrane and electrically connected with contact pads of the support plate, this flexible membrane being made as indicated above.

According to an aspect of the invention, the probe card can comprise a damping structure interposed between the flexible membrane and the support plate, preferably comprising a plurality of preloading probes adapted to abut onto the flexible membrane in correspondence of the central portion.

Finally, the probe card can comprise a plurality of micro contact probes having a height of less than 200 µm.

The features and advantages of the flexible membrane and of the probe card according to the invention will be apparent from the following description of an embodiment thereof given by way of non-limiting example with reference to the attached drawings.

BRIEF DESCRIPTION OF DRAWINGS

In the drawings:

FIGS. 3A-3C schematically show alternative embodiments of a flexible membrane made according to the present invention and comprised in the probe card of FIG. 2;

DETAILED DESCRIPTION OF THE INVENTION

With reference to the figures, and particularly to FIG. 2, a probe card made according to the present invention is globally and schematically indicated with 20.

It should be noted that the figures are schematic views and are not drawn to scale, but they are instead drawn so as to emphasize the important features of the invention. Furthermore, in the figures, the different elements are schematically depicted, the shape thereof being changeable depending on the desired application. Moreover, it should be noted that in the figures identical reference numbers refer to identical elements in terms of shape or function. Finally, special arrangements described in relation to an embodiment illustrated in a figure can also be used for the other embodiments illustrated in the other figures.

Figure 1:
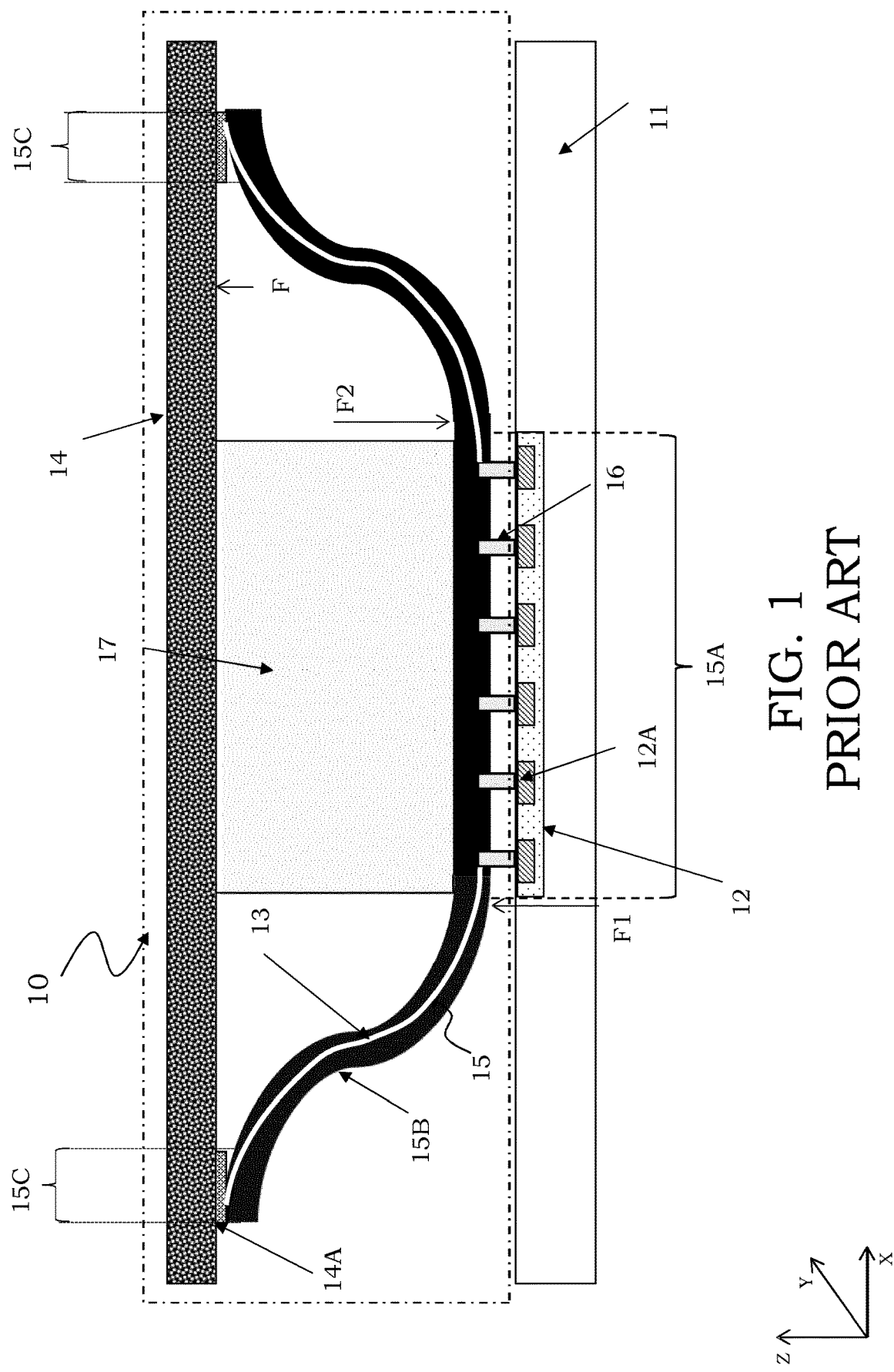
FIG. 1 schematically shows a probe card for high-frequency applications made according to the prior art.
Figures 2A, 2B:
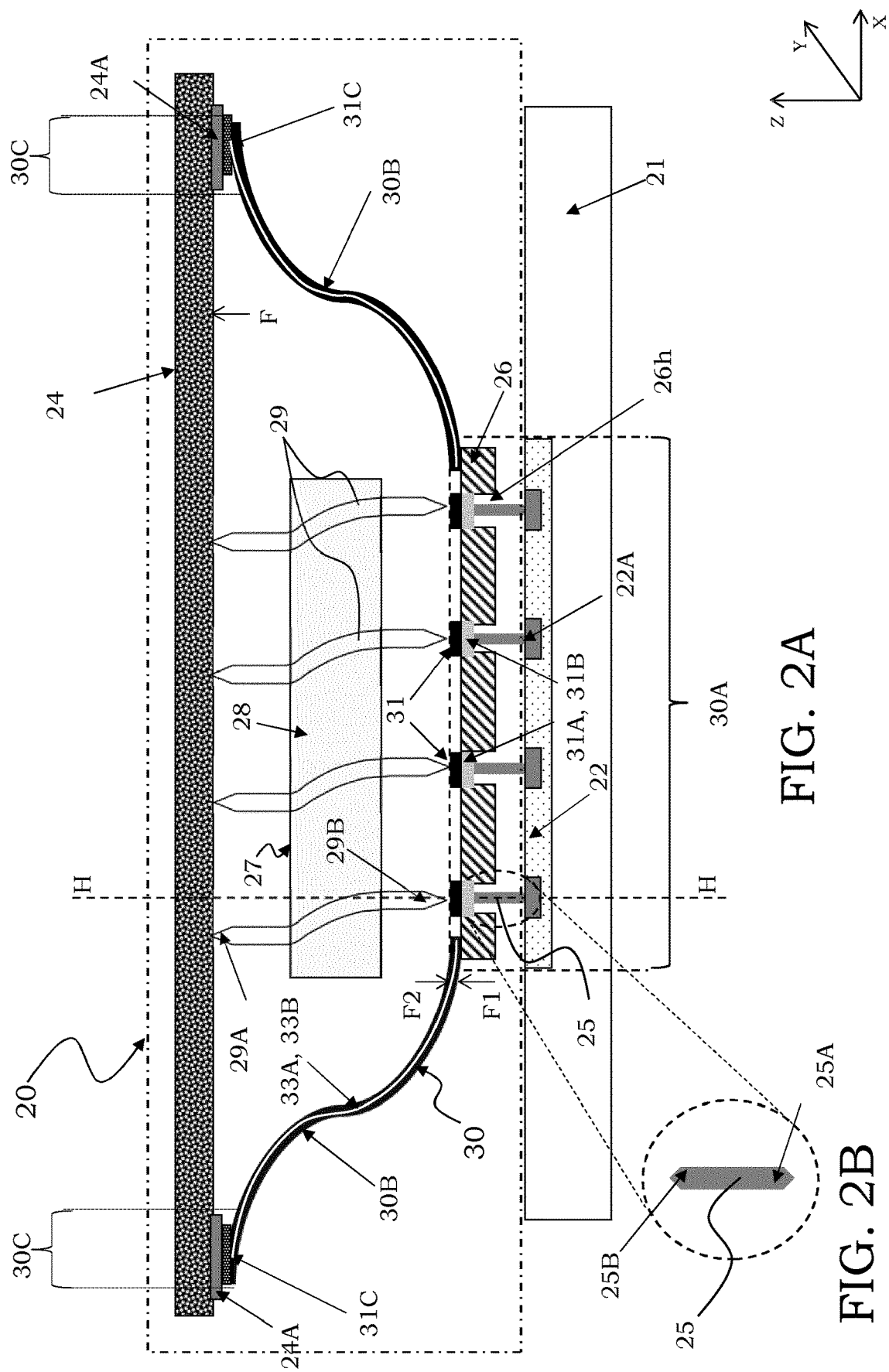
FIG. 2A schematically shows a probe card for high-frequency (RF) power applications made according to the present invention and FIG. 2B shows in an enlarged scale a micro contact probe comprised in the probe card of FIG. 2A.

In its most general form, the probe card 20 is a component adapted to connect with an apparatus (not shown in the Figures) to perform the test of electronic devices 22 integrated on a semiconductor wafer 21. More particularly, the probe card 20 illustrated in FIG. 2A is suited to high-frequency (RF) power applications, that is to carry signals with frequencies of more than 1 GHz and power values of more than 35 dBm. These signals will be indicated as Power RF signals herebelow.

As schematically illustrated in FIG. 2A, the probe card 20 comprises in that case at least one damping structure 27 shaped as a probe head, which comprises a main body 28 which houses and supports a plurality of contact elements, four of these contact elements being shown in FIG. 2A only by way of example. The main body 28 can comprise for example a pair of plate-like guides equipped with guide holes through which the contact elements slide, which serve as damping or preloading elements, as it will be explained herebelow, and they are thus indicated as preloading probes 29 herebelow. Each preloading probe 29 comprises at least one first end portion 29A and one second end portion 29B and moves independently from the adjacent preloading probes.

The preloading probes 29 have a length comprised between 1.5 mm and 10 mm and are made of materials adapted to have an adequate bending capacity and to maximize the damping effect. In particular, it is possible to make the preloading probes with the materials commonly used to form the contact probes of the regular probe heads.

The probe card 20 further comprises a support plate 24, which is preferably a printed circuit board (PCB) which ensures the connection between this probe card 20 and a testing apparatus (not shown); the support plate 24 thus acts as an interface card with the testing apparatus. In particular, the first end portion 29A of the preloading probes 29 is adapted to abut onto the support plate 24.

The probe card 20 further comprises a flexible membrane 30 made according to the present invention, which has a first face F1, onto which the second end portion 29B of the preloading probes 29 is adapted to abut, and a second face F2, opposed to the first face F1, this second face F2 being a lower face according to the local reference of FIG. 2A, that is a face turned towards a device under test 22 integrated in the semiconductor wafer 21, and this first face F1 being an upper face according to the local reference of FIG. 2A, that is a face turned towards the damping structure 27 and the support plate 24.

Suitably, the preloading probes 29 are in mechanical contact but not electrical contact with the support plate 24 and with the flexible membrane 30.

The damping structure 27 is thus interposed between the flexible membrane 30 and the support plate 24. Specifically, the flexible membrane 30 comprises a first portion or central portion 30A intended to contact the damping structure 27 and thus the preloading probes 29 and a second portion or peripheral portion 30C intended to contact the support plate 24; the flexible membrane 30 further comprises an intermediate connecting portion 30B between the central portion 30A and the peripheral portion 30C. The intermediate portion 30B is a portion intended to deform, in particular to lengthen and shorten, following the movement of the device under test 22 integrated on the semiconductor wafer 21 in contact with the central portion 30A during the testing operation thereof performed by the probe card 20.

The flexible membrane 30 is electrically connected with the support plate 24 through the peripheral portion 30C thereof, this electrical connection occurring for example through suitable conductive contact pads 24A of the support plate 24 and suitable contact pads or conductive portions 31C made on the flexible membrane 30 in the peripheral portion 30C thereof.

As shown in FIG. 2A, the contact pads 24A of the support plate 24 are made on a face F thereof turned towards the damping structure 27 and towards the flexible membrane 30, this face F being a lower face according to the local reference of FIG. 2A.

In an embodiment not illustrated in the figures, the support plate 24 can comprise suitable openings to allow the flexible membrane 30 to pass therethrough, this flexible membrane 30 being in this case connected with contact pads (not illustrated) made on a face which is opposed to the face F of the support plate 24, that is on an upper face thereof according to the local reference of FIG. 2A. Alternatively, the flexible membrane 30 can be directly connected to the testing apparatus.

In a preferred embodiment of the present invention, the conductive portions 31C of the flexible membrane 30 are connected to the contact pads 24A of the support plate 24 by a pressing contact. Alternatively, the flexible membrane 30 and the support plate 24 can be associated by means of a conductive rubber or a weld in correspondence of the peripheral portion 30C of the flexible membrane 30.

Suitably, the central portion 30A of the flexible membrane 30 is associated with at least one bearing element or support 26, which is preferably plate-like.

In a preferred embodiment of the present invention, the support 26, on which the flexible membrane 30 is arranged, comprises a plurality of housings 26h for a plurality of micro contact probes 25, which are adapted to contact the contact pads 22A of the device under test 22. The flexible membrane 30, in particular the central portion 30A thereof, is interposed between the preloading probes 29 and the micro contact probes 25 and is adapted to insulate each preloading probe 29 from a corresponding micro contact probe 25.

More particularly, as illustrated in the enlarged view of FIG. 2B, each micro contact probe 25 comprises a first end portion 25A adapted to abut onto a contact pad 22A of the device under test 22 and a second end portion 25B adapted to abut onto a corresponding contact pad made on the second face F2 of the flexible membrane 30 in the central portion 30A thereof, arranged in correspondence of the device under test 22.

In an embodiment, the micro contact probes 25 are integral with the central portion 30A of the flexible membrane 30, in particular grown thereon.

The micro contact probes 35 can be T-shaped (or overturned mushroom-shaped), in which the stem of the T is connected to the flexible membrane 30 while the head of the T is adapted to contact the contact pads 22A of the device under test 22. Alternatively, the contact probes 35 can be shaped as conductive bumps, which can include in turn a projecting contact portion for contacting the contact pads 22A of the device under test 22. It is evident that the above-stated examples should not be construed as limiting the present invention, the micro contact probes 25 being able to have any suitable shape for the connection with the contact pads 22A of the device under test 22 integrated on the semiconductor wafer 21, for example they can be shaped as so-called pillars or overturned, possibly truncated, pyramids.

The micro contact probes 25 are made of a conductive material selected for example from platinum, rhodium, palladium, silver, copper or an alloy thereof, preferably a platinum alloy.

Suitably, the micro contact probes 25 have a reduced height, in particular a height of less than 200 µm, in general comprised between 10 µm and 200 µm, height meaning a dimension of these contact probes 25 measured in a direction which is orthogonal to the device under test 22 and thus to the semiconductor wafer 21, that is along the axis Z of the local reference system indicated in the figure. In this way, the micro contact probes 25 of the probe card 20 of the present invention are adapted for testing high-frequency devices, the height thereof being adapted to avoid disadvantageous self-inductance phenomena.

Advantageously according to the present invention, the flexible membrane 30 comprises suitable conductive tracks 33A or 33B adapted to carry signals from the micro contact probes 25 towards the support plate 24, that is from the central portion 30A thereof to the peripheral portion 30C thereof. Suitably, as it will be explained herebelow, the flexible membrane 30 according to the present invention, has a multilayer structure comprising dielectric layers and conductive layers, suitably alternated and shaped.

The conductive tracks 33A or 33B can be made on a surface of the flexible membrane 30, in particular on the second face F2 or upper face thereof according to the local reference of the figure or inside the flexible membrane 30 itself and extend from the central portion 30A of the flexible membrane 30, in contact with a corresponding micro contact probe 25, along the intermediate portion 30B of this flexible membrane 30 up to reach the peripheral portion 30C thereof. It is also possible to make the conductive tracks on the first face F1 of the flexible membrane 30 and suitable electric contact structures, such as metallized through holes or conductive vias between the first face F1 and the second face F2 of the flexible membrane 30, for the contact of these conductive tracks with the support plate 24, in particular with the contact pads 24A thereof.

In a preferred embodiment, illustrated in FIG. 2A, the flexible membrane 30 is suitably shaped so as to comprise, preferably in the central portion 30A thereof, a plurality of strips or offcuts 31. The distal end of each strip 31 comprises, on the first face F1 turned towards the device under test 22, a contact pad, 31A or 31B, preferably made of a metal material, onto which the second end portion 25B of a micro contact probe 25 abuts.

Furthermore, the second end portion 29B of each preloading probe 29 abuts onto the second face F2 of the flexible membrane 30, always at the distal end of a strip 31, the second end portion 29B of the preloading probes 29 and the second end portion 25B of the micro contact probes 25 thus both abutting against the distal end 27B of a same corresponding strip 31 of the flexible membrane 30, but from opposite sides of this strip 31, i.e. on the first face F1 and on the second face F2 of the flexible membrane 30, respectively.

In this way, the preloading probes 29 act as damping elements for the micro contact probes 25, which ensure signal carrying between the probe card 20 and the device under test 22 integrated on the semiconductor wafer 21 by means of the conductive tracks made in the flexible membrane 30. In other words, the electrical signals are carried by the device under test 22 to the support plate 24 through the micro contact probes 25 and the conductive tracks 33A or 33B made in the flexible membrane 30 while the mechanical behaviour of the probe card 20 as a whole is determined by the movement of the micro contact probes 25, of the flexible membrane 30 and of the damping structure 27 resting on the support plate 24.

Suitably, each preloading probe 29 moves independently from the adjacent ones, so that each micro contact probe 25 moves independently from the adjacent ones during the contact with the contact pads 22A of the device under test 22. This allows, together with the flexibility of the interposed flexible membrane 30, and in particular of the strips 31 thereof, possible level differences of the device under test 22, in particular of the contact pads 22A thereof, to be effectively compensated.

The preloading probes 29 also keep the flexible membrane 30, in particular the strips 31 thereof, pressed against the second end portion 25A of the micro contact probes 25, these preloading probes 29 thus also ensuring the proper mechanical coupling between the micro contact probes 25 and the flexible membrane 30, in particular the strips 31 thereof. Suitably, each micro contact probe 25 is in pressing contact on a contact pad 31A or 31B made on a strip 31 at the first face F1 of the flexible membrane 30 and a corresponding preloading probe 29 is resting on this strip 31 at the second face F2 of the flexible membrane 30, so as to obtain the desired mechanical coupling of the probe card 20, each contact pad 31A or 31B being also in contact with a respective conductive track 33A or 33B made in the flexible membrane 30 and in connection with a respective conductive portion 31C of the flexible membrane 30 for the electrical connection with the support plate 24, in particular with the contact pads 24A thereof.

The flexible membrane 30 is made of dielectric materials, preferably polyamide, which are able to provide the desired flexibility and the desired electrical insulation, while the conductive tracks are preferably made of copper.

Usually, the conductive tracks are made by means of copper traces with the thickness of 10-15 µm on a polyamide membrane with a thickness of 50 µm; since in typical applications a controlled impedance at 50Ω must be ensured, the copper traces have a width of 50 µm and a length up to some centimetres to fully go through the flexible membrane 30 and reach the support plate 24 and thus the testing apparatus.

Traces with the above-indicated dimensions properly operate when they carry low-power RF signals, that is with power values of less than 35 dBm. Nevertheless they prove to be unsuited to high-power RF applications, that is when carrying Power RF signals. In that case, in fact, the high values of power and thus of current bring the copper traces having a width of 50 µm and a thickness of 10-15 µm to temperature values which can even reach 600° C., which degrades the polyamide substrate of the flexible membrane 30 and thus results in the destruction of the membrane itself and in the malfunction of the probe card 20 comprising it.

In order to be able to carry these Power RF signals, it is thus necessary to use conductive tracks with a width of more than 50 μm and, to ensure a controlled impedance of 50Ω, also to increase the thickness of the flexible membrane 30. Nevertheless, an increased thickness of the flexible membrane 30 causes an undesired stiffening thereof and a difficulty in handling the micro contact probes 25, which prevents a proper operation of the probe card 20 comprising it.

Advantageously according to the present invention, as schematically illustrated in FIG. 3A, the flexible membrane 30 is divided into a first area 34A having a first total thickness HA and into a second area 34B having a second total thickness HB, the second total thickness HB being greater than the first total thickness HA, thickness meaning a dimension of the membrane 30 in a direction which is orthogonal to a development plane thereof in rest conditions, the membrane being substantially planar. In its more general form, the central portion 30A has a first total thickness HA with values corresponding to the current known solutions, in particular with values which are lower or equal to 75 μm, preferably lower or equal to 50 μm.

Suitably, the first area 34A extends so as to comprise the central portion 30A of the flexible membrane 30, that is in correspondence of the device under test 22. In the first area 34A of the flexible membrane 30 the contact pads 31A or 31B of the micro contact probes 25 are thus made.

On the contrary, the second area 34B extends so as to comprise the intermediate portion 30B and the peripheral portion 30C of the flexible membrane 30 and it thus comprises the conductive portions 31C of the flexible membrane 30 connected to the contact pads 24A of the support plate 24.

In a preferred embodiment illustrated in FIG. 3A, the flexible membrane 30 comprises a multilayer structure formed by a plurality of elastic layers and of conductive layers alternating with each other; more particularly the flexible membrane 30 comprises a multilayer structure formed by a first elastic layer PL1 in which a first conductive layer ML1 is made, topped by a second elastic layer PL2 in which a second conductive layer ML2 is made and by a third elastic layer PL3 in which a third conductive layer ML3 is made, as well as a final elastic layer FL which covers the third elastic layer PL3 and the second elastic layer PL2, where it is not topped by the third elastic layer PL3. More particularly, the first elastic layer PL1, the first conductive layer ML1 and the second elastic layer PL2 extend for the entire length of the flexible membrane 30, that is along the first area 34A and the second area 34B, length meaning the dimension of the flexible membrane 30 along the axis X of the local reference of FIG. 3A. The second conductive layer ML2 comprises traces which extend along the whole first area 34A and partially penetrate in the intermediate portion 30B and traces which extend for the entire length of the flexible membrane 30, that is along the first area 34A and the second area 34B, as it will be explained herebelow. Finally, the third elastic layer PL3 and the third conductive layer ML3 only extend along the second area 34B.

Suitably, the first elastic layer PL1, the second elastic layer PL2, the third elastic layer PL3 and the final elastic layer FL are made of polyamide while the first conductive layer ML1, the second conductive layer ML2 and the third conductive layer ML3 comprise copper traces adapted to form the conductive tracks 33A, 33B of the flexible membrane 30. More particularly, the first elastic layer PL1, the second elastic layer PL2 and the third elastic layer PL3 have a respective first thickness H1, second thickness H2 and third thickness H3 having values comprised between 10 μm and 30 μm, preferably 25 μm, while the final elastic layer FL has a fourth thickness H4 having a value comprised between 5 μm and 15 μm, preferably 5 μm. The first conductive layer ML1, the second conductive layer ML2 and the third conductive layer ML3 substantially have the same thicknesses, indicated with HML and having values comprised between 10 μm and 15 μm, preferably 10 μm. Thicknesses mean dimensions along the axis Z of the local reference of FIG. 3A.

In an embodiment, the second thickness HB is 2 to 4 times the first thickness HA, allowing conductive tracks having two or three times the width of traditional copper traces to be formed. In other words, for a first thickness HA having values comprised between 40 μm and 50 μm, the second thickness can have values comprised between 70 μm and 125 μm so as to be able to enlarge the metal traces up to widths of 200 μm-400 μm. Metal tracks with such a width can allow signals with powers from dBm to 45 dBm to be carried while ensuring a controlled impedance at 50Ω.

Suitably, in the final elastic layer FL openings Ap are arranged in correspondence of which contact pads 31A, 31B with the micro contact probes 25 are made. In particular, these openings Ap are made in the central portion 30A, that is at the first area 34A with a lower thickness, where only the first elastic layer PL1 and the second elastic layer PL2 are overlapped.

The flexible membrane 30 further comprises projecting structures made on the final elastic layer FL in correspondence of the peripheral portion 30C, that is in the second area 34B with a greater thickness, these projecting structures having a base 32 on which the conductive portions 31C are made, for the connection with the contact pads 24A of the support plate 24.

Suitably, the flexible membrane 30 also comprises conductive structures or THs (THrough-all vias) connecting different conductive layers, in particular traces made in different conductive layers. For example, the flexible membrane 30 comprises first conductive structures TH1 connecting traces made in the first conductive layer ML1 and in the second conductive layer ML2, second conductive structures TH2 connecting traces made in the second conductive layer ML2 and in the third conductive layer ML3 and third conductive structures TH3 connecting traces made in the third conductive layer ML3 and the bases 32 of the conductive portions 31C. According to an alternative embodiment, also the conductive structures of the TH type are adapted to carry RF signals.

Advantageously according to the present invention, the flexible membrane 30 comprises traces made in the third conductive layer ML3 having a width which is greater than a width of traces made in the second conductive layer ML2, width meaning a dimension in the direction Y of the local reference of FIG. 3A. Making these traces with a greater width in the third conductive layer ML3 is possible due to the presence of the overlapping of the second elastic layer PL2 and the third elastic layer PL3, that is due to the presence of the second area 34B having a greater thickness than the first area 34A, the increased thickness below the third conductive layer ML3 allowing a controlled impedance to be ensured, in particular which is equal to 50Ω also for the traces with a greater width.

In a preferred embodiment, the traces of the conductive layers are made in suitable grooves arranged in the underlying elastic layers. In other words, the first conductive layer ML1 comprises a plurality of traces made in grooves arranged in the first elastic layer PL1, the second conductive layer ML2 comprises a plurality of traces made in grooves arranged in the second elastic layer PL2 and the third conductive layer ML3 comprises a plurality of traces made in grooves arranged in the third elastic layer PL3.

Figure 4:
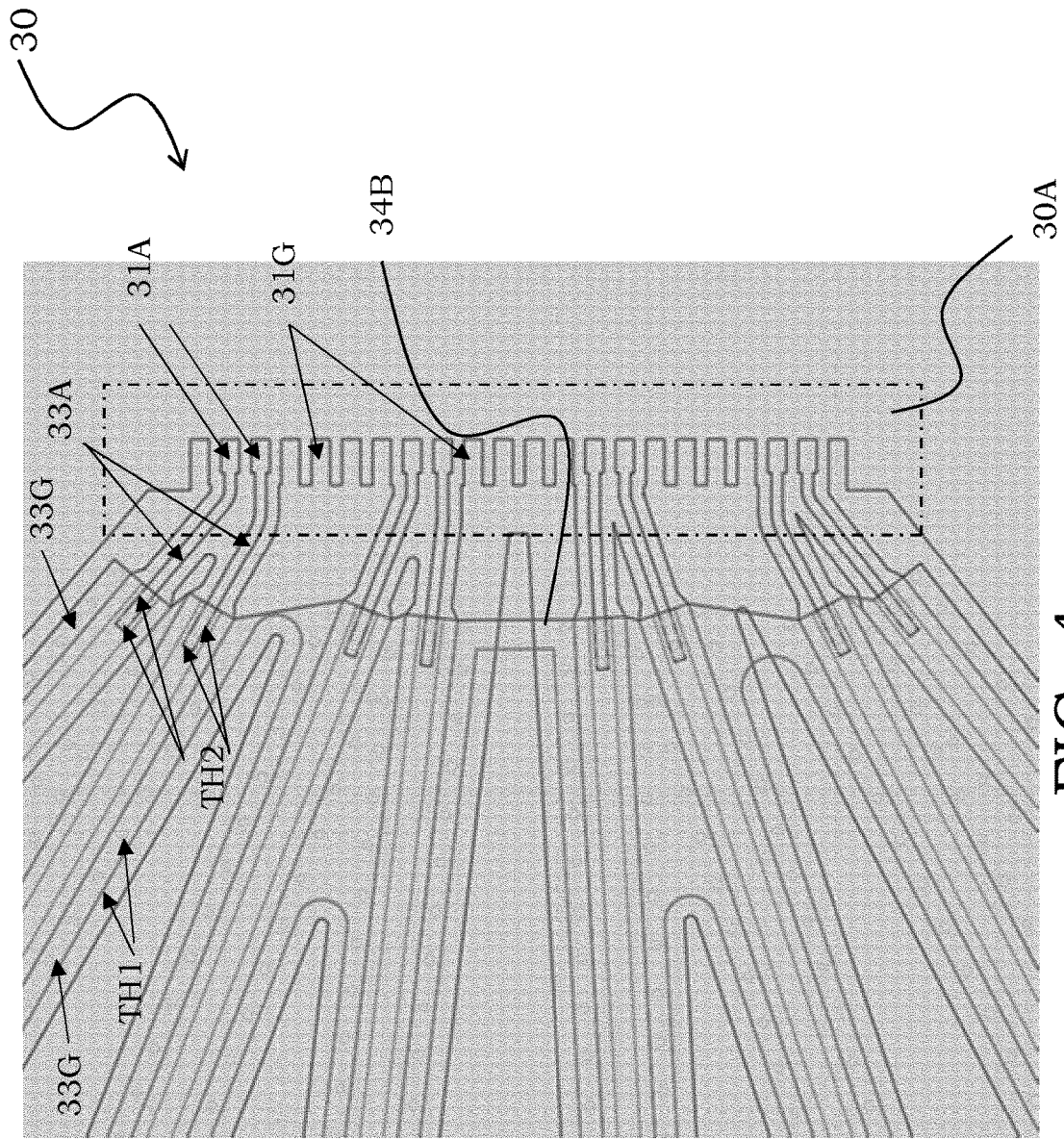
FIG. 4 schematically shows in an enlarged scale a detail of the flexible membrane of FIG. 3A.

In particular, as schematically illustrated in FIG. 4, the flexible membrane 30 comprises first conductive tracks 33A which include a first portion formed by a trace made in the second conductive layer ML2 and a second portion formed by a trace having a greater width made in the third conductive layer ML3, interconnected by means of second conductive structures TH2, each first conductive track 33A being connected to a first contact pad 31A made in the central portion 30A of the flexible membrane 30 and adapted to contact a micro contact probe 25 for carrying Power RF signals. The first contact pads 31A are thus also indicated as Power RF pads.

Suitable ground lines or grounds are made by means of ground conductive tracks 33G which include a first portion formed by a trace made in the second conductive layer ML2 and a second portion formed by a trace made in the first conductive layer ML1, interconnected by means of first conductive structures TH1, each ground conductive track 33G being connected to a ground pad 31G made in the central portion 30A of the flexible membrane 30.

According to an alternative embodiment schematically illustrated in FIG. 3B, the second area 34B of the flexible membrane 30 is not continuous but formed by a plurality of single reliefs or rails 35 made in the third elastic layer PL3 separated by air gaps. Suitably, the third conductive layer ML3 comprises portions of the first conductive tracks 33A made in correspondence of the rails 35.

Figure 3C:
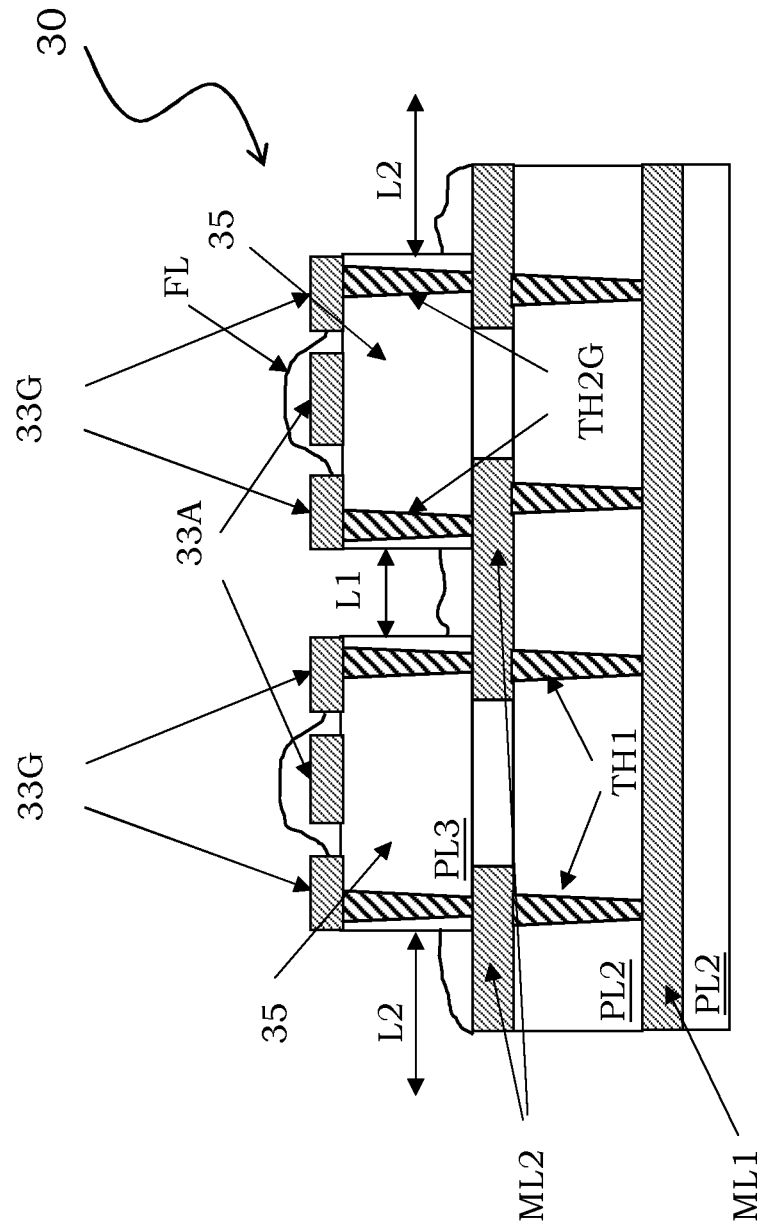

According to a further alternative embodiment schematically illustrated in FIG. 3C, the third conductive layer ML3 also comprises third portions of the ground conductive tracks 33G made in correspondence of the rails 35, these third portions being connected to the first portions formed by traces made in the second conductive layer ML2 by means of further conductive structures TH2G.

Suitably, each rail 35 has a width LS, that is a dimension along the axis Y of the local reference of FIG. 3B, having values of more than 1 mm, which is thus able to house conductive tracks 33A having a width LT of more than 50 µm for carrying Power RF signals. A width L1 of 5 mm or more or a width L2 of 10-20 mm or more can be left between the rails 35.

Figures 5A, 5B:
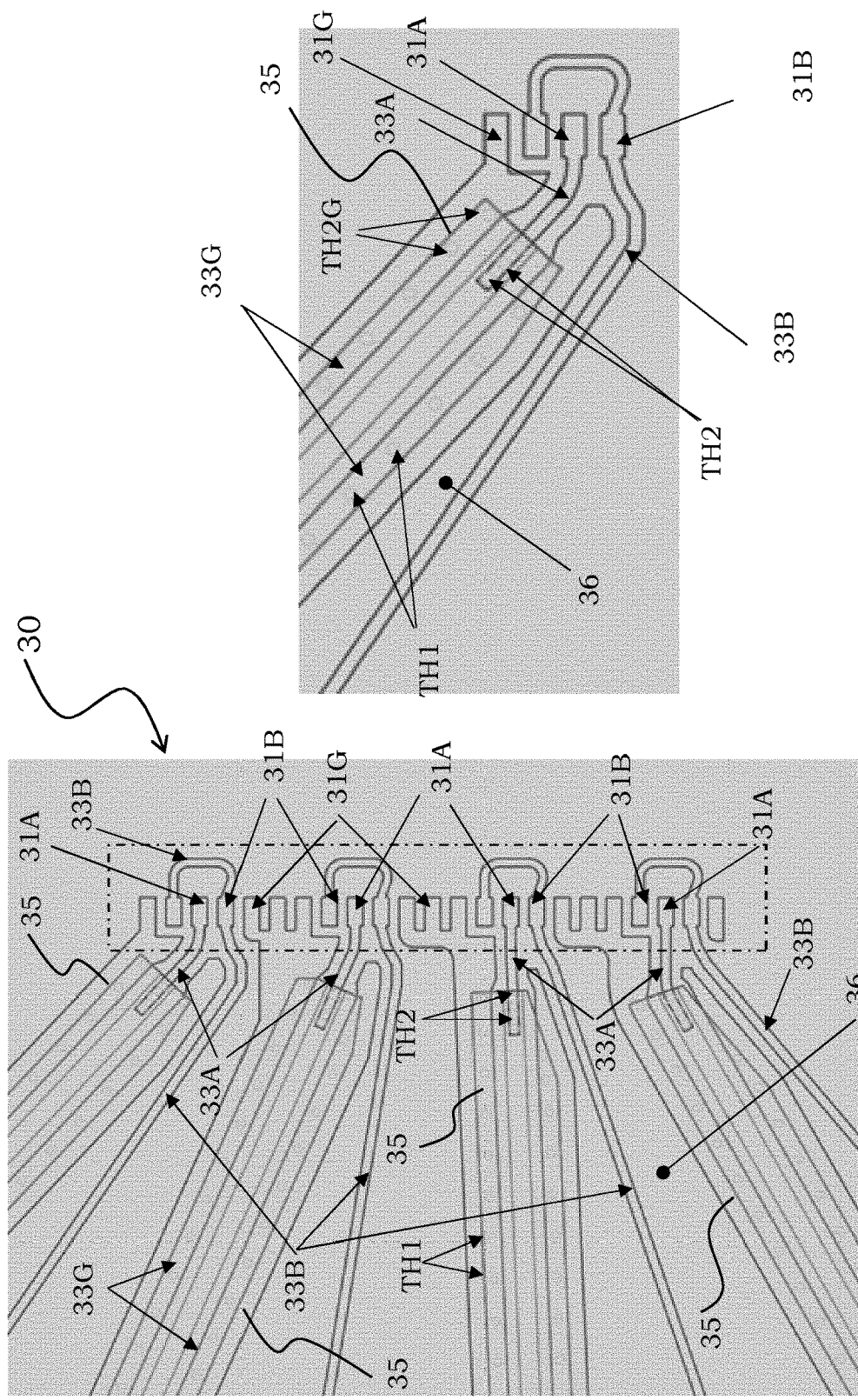
FIGS. 5A and 5B show in an enlarged scale some details of the flexible membrane of FIG. 3B and FIG. 3C, respectively.

As previously seen, the first conductive tracks 33A are thus made in correspondence of the rails 35, suitably flanked by a pair of ground conductive tracks 33G, as schematically illustrated in FIG. 5A and in FIG. 5B according to the alternative embodiments of FIGS. 3B and 3C, respectively.

In that case, it is possible to provide second conductive tracks 33B made in the second conductive layer ML2 in correspondence of areas of the second elastic layer PL2 which are free from the rails 35 which form the third elastic layer PL3. The second conductive tracks 33B prove to be adapted to carry RF non-power signals and are connected to second contact pads 31B always made in the central portion 30A of the flexible membrane 30 and connected to micro contact probes 25 adapted to carry RF non-power signals. The second contact pads 31B are thus also indicated as RF non-power pads.

Figure 6:
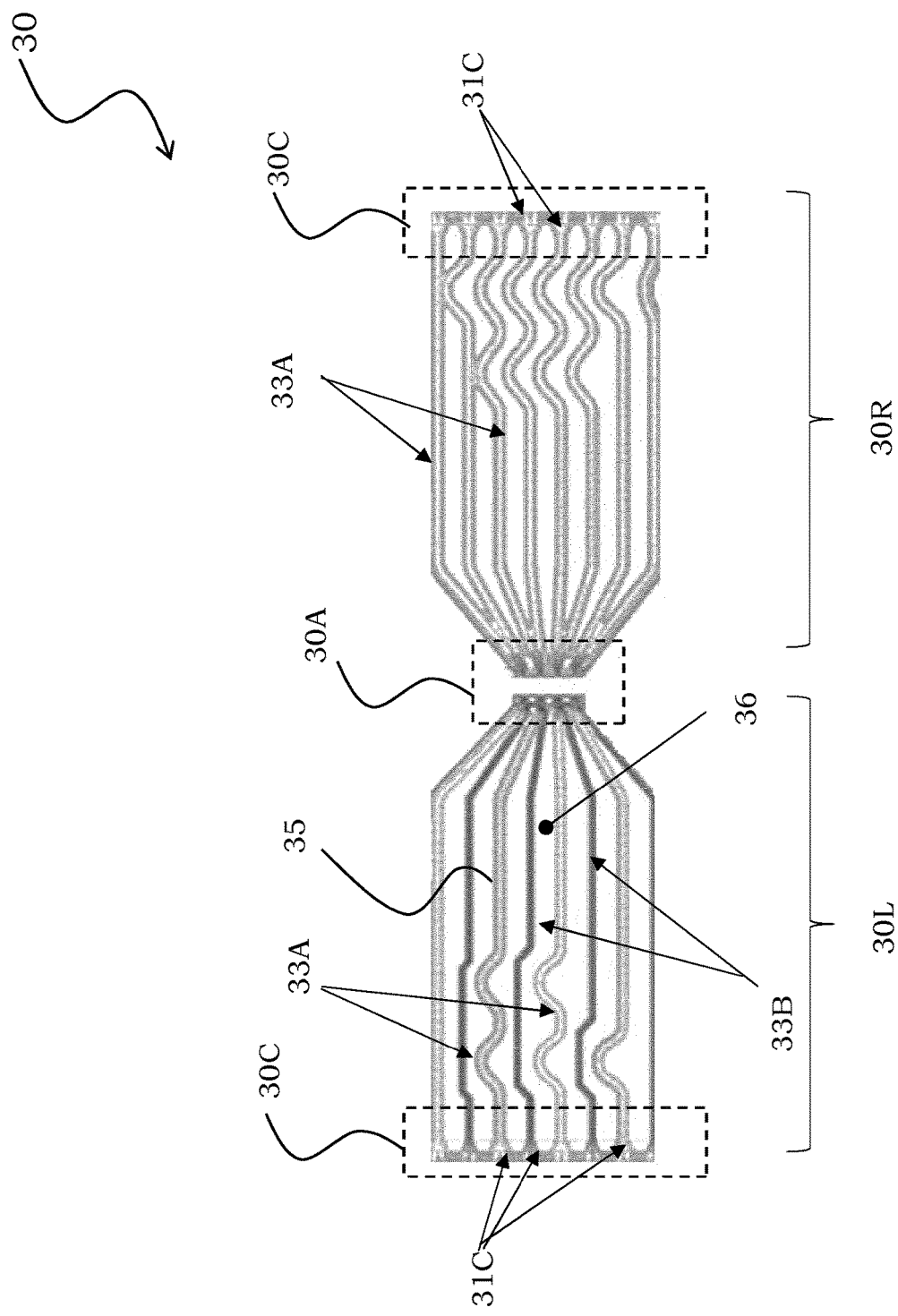
FIG. 6 schematically shows in a top view the flexible membrane of FIG. 3B.

The distribution of the rails 35 and consequently of the first conductive tracks 33A for carrying Power RF signals can be different in correspondence of different portions of the flexible membrane 30, as schematically illustrated in FIG. 6, where the flexible membrane 30 comprises a right portion 30R of the flexible membrane 30 having a greater density of rails 35 and a left portion 30L of the flexible membrane 30 having a lower density of rails 35.

The first conductive tracks 33A, the second conductive tracks 33B and the ground conductive tracks 33G are also connected to conductive portions 31C made in the peripheral portion 30C of the flexible membrane 30.

In conclusion, the flexible membrane according to the present invention allows a probe card to be made which is suited to Power RF applications with an architecture only comprising micro contact probes, that is able to carry signals, both of the Power RF type and of the RF non-power type, all thanks to the micro contact probes and through the metal tracks made in the flexible membrane, without having to resort to mixed configurations with probes having traditional dimensions accompanied by micro contact probes, as it happens in known solutions.

Suitably, the flexible membrane comprises at least one first area having a reduced thickness and one second area having an increased thickness, the first area being made at the portion of the membrane in correspondence of the device under test, so as to be able to make conductive tracks with a width adapted to carry RF power signals, while ensuring a controlled impedance at 50Ω.

According to an alternative embodiment, the second portion having an increased thickness is not continuous but it comprises a plurality of rails where the metal tracks having a greater width are made, the areas of the membrane between these rails having a thickness which is equal to the first portion and being adapted to make metal tracks with a rated width for carrying RF non-power signals.

Obviously, in order to meet contingent and specific requirements, a person skilled in the art will be allowed to bring several modifications and alternatives to the above-described probe card, all falling within the scope of protection of the invention as defined by the following claims.

For example the flexible membrane can be made so as to comprise a right portion comprising rails which form the part having a greater thickness and a left portion comprising a part having a uniformly increased thickness. Furthermore, it is possible to make rails having thicknesses which are different from each other.

Finally, it is possible to provide a different number of elastic layers and of conductive layers with respect to what is described above and illustrated in the figures.

The invention claimed is:

1. A flexible membrane adapted to carry high-frequency power signals, comprising:
a central portion provided with a plurality of contact pads;
a peripheral portion provided with a plurality of contact structures;
an intermediate portion arranged and connected between the central portion and the peripheral portion; and
a plurality of conductive tracks realised in the flexible membrane,
wherein the plurality of contact pads are adapted to electrically connect a plurality of micro contact probes and the plurality of contact structures being adapted to electrically connect a support plate,
wherein each of the conductive tracks are adapted to electrically connect one of the contact pads with one of the contact structures, the flexible membrane being divided into a first area having a first total thickness and into a second area having a second total thickness,
wherein the first area is contiguous and adjacent to the second area, and
wherein the first total thickness is less than or equal to 75 µm, the second total thickness is greater than the first total thickness, and the first area of the flexible membrane extending in correspondence of the central portion and comprising the plurality of contact pads.

2. The flexible membrane of claim 1, wherein the central portion comprises a plurality of strips on which the contact pads of the micro contact probes are made.

3. The flexible membrane of claim 1, further comprising a multilayer structure formed by a plurality of elastic layers and conductive layers alternating with each other, the conductive layers comprising a plurality of conductive traces adapted to form the conductive tracks for connecting the contact pads with the contact structures, the conductive traces made in the first area having a lower width than the conductive traces made in the second area.

4. The flexible membrane of claim 3, further comprising conductive structures adapted to connect conductive traces made in different conductive layers, and a multilayer structure formed by a first elastic layer in which a first conductive layer is made, which is topped by a second elastic layer in which a second conductive layer is made, by a third elastic layer in which a third conductive layer is made and by a final elastic layer, which covers the third elastic layer and the second elastic layer, where it is not topped by the third elastic layer.

5. The flexible membrane of claim 4, wherein the first elastic layer, the first conductive layer and the second elastic layer extend along the first area and the second area of the flexible membrane, and wherein the third elastic layer and the third conductive layer extend just along the second area, the second conductive layer comprising a first plurality of conductive traces which extend along the first area, partially penetrate into the intermediate portion of the flexible membrane and are in connection with a plurality of conductive traces made in the third conductive layer.

6. The flexible membrane of claim 5, wherein the second conductive layer further comprises a second plurality of conductive traces which extend along the first area and the second area.

7. The flexible membrane of claim 5, further comprising:
first conductive structures connecting conductive traces made in the first conductive layer and in the second conductive layer;
second conductive structures connecting conductive traces made in the second conductive layer and in the third conductive layer; and
third conductive structures connecting traces made in the third conductive layer and bases protruding from the third conductive layer and electrically connected with the conductive portions of the flexible membrane.

8. The flexible membrane of claim 5, wherein the conductive traces made in the third conductive layer have a greater width than the conductive traces made in the second conductive layer.

9. The flexible membrane of claim 5, wherein the conductive traces are made in grooves arranged in the elastic layers.

10. The flexible membrane of claim 5, further comprising first conductive tracks which comprise a first portion formed by a conductive trace made in the second conductive layer and a second portion formed by a conductive trace having a greater width made in the third conductive layer,
wherein each first conductive track is connected to a first contact pad made in the central portion of the flexible membrane and adapted to contact a micro contact probe for carrying high-frequency power signals, that signals with a frequency of more than 1 GHz and a power of more than 35 dBm.

11. The flexible membrane of claim 10, further comprising ground lines made by means of ground conductive tracks which comprise:
a first portion formed by a trace made in the second conductive layer; and
a second portion formed by a trace made in the first conductive layer,
wherein the first and second portions are interconnected by means of first conductive structures, each ground conductive track is connected to a ground pad made in the central portion of the flexible membrane, and the ground conductive tracks further comprise:
a third portion formed by a trace made in the third conductive layer, and further conductive structures, the third portion being interconnected to the first portion formed by a trace made in the second conductive layer by means of the further conductive structures.

12. The flexible membrane of claim 10, further comprising second conductive tracks made by conductive traces of the second conductive layer, arranged in correspondence of areas of the second elastic layer which form the third elastic layer, wherein each second conductive track is connected to a second contact pad made in the central portion of the flexible membrane and adapted to contact a micro contact probe for carrying high-frequency non-power signals that signals with a frequency of more than 1 GHz and a power of less than 35 dBm, and wherein the first conductive tracks, the second conductive tracks and the ground conductive tracks are further connected to conductive portions made in the peripheral portion of the flexible membrane.

13. The flexible membrane of claim 1, being made of a dielectric material and comprising conductive tracks being made of a conductive material.

14. The flexible membrane of claim 13, being made of polyamide and comprising conductive tracks being made of copper.

15. A flexible membrane adapted to carry high-frequency power signals, comprising:
a central portion provided with a plurality of contact pads;
a peripheral portion provided with a plurality of contact structures;
an intermediate portion arranged and connected between the central portion and the peripheral portion; and
a plurality of conductive tracks realised in the flexible membrane,
wherein the plurality of contact pads being adapted to electrically connect a plurality of micro contact probes and the plurality of contact structures being adapted to electrically connect a support plate, each of the conductive tracks being adapted to electrically connect one of the contact pads with one of the contact structures, the flexible membrane being divided into a first area having a first total thickness and into a second area having a second total thickness, the first area is contiguous and adjacent to the second area, and the first total thickness being less than or equal to 75 µm and the second total thickness is greater than the first total thickness, the first area of the flexible membrane extending in correspondence of the central portion and comprising the plurality of contact pads, and the second area comprising a plurality of rails separated by air gaps.

16. The flexible membrane of claim 15, further comprising a multilayer structure formed by a plurality of elastic layers and of conductive layers alternating with each other, the conductive layers comprising a plurality of conductive traces adapted to form the conductive tracks for connecting the contact pads with the contact structures, conductive traces made in the first area having a lower width than conductive traces made in the second area, the conductive traces having a greater width being made at the rails.

17. The flexible membrane of claim 15, wherein the central portion comprises a plurality of strips on which the contact pads of the micro contact probes are made.

18. The flexible membrane of claim 15, being made of a dielectric material and comprising conductive tracks being made of a conductive material.

19. The flexible membrane of claim 15, being made of made of polyamide and comprising conductive tracks being made of copper.

20. The flexible membrane of claim 15, further comprising conductive structures adapted to connect conductive traces made in different conductive layers, and a multilayer structure formed by a first elastic layer in which a first conductive layer is made, which is topped by a second elastic layer in which a second conductive layer is made, by a third elastic layer in which a third conductive layer is made and by a final elastic layer, which covers the third elastic layer and the second elastic layer, where it is not topped by the third elastic layer, the third elastic layer comprising the rails.

21. The flexible membrane of claim 20, wherein the first elastic layer, the first conductive layer and the second elastic layer extend along the first area and the second area of the flexible membrane, and the third elastic layer and the third conductive layer extend just along the second area, the second conductive layer comprising a first plurality of conductive traces which extend along the first area, partially penetrate into the intermediate portion of the flexible membrane and are in connection with a plurality of conductive traces made in the third conductive layer.

22. The flexible membrane of claim 21, wherein the second conductive layer further comprises a second plurality of conductive traces which extend along the first area and the second area in correspondence of the air gaps which separate the rails.

23. The flexible membrane of claim 20, further comprising: first conductive structures connecting conductive traces made in the first conductive layer and in the second conductive layer, second conductive structures connecting conductive traces made in the second conductive layer and in the third conductive layer, and third conductive structures connecting traces made in the third conductive layer and bases protruding from the third conductive layer and electrically connected with the conductive portions of the flexible membrane.

24. The flexible membrane of claim 20, wherein the conductive traces made in the third conductive layer have a greater width than conductive traces made in the second conductive layer.

25. The flexible membrane of claim 20, wherein the conductive traces are made in grooves arranged in the elastic layers.

26. The flexible membrane of claim 20, further comprising second conductive tracks made by conductive traces of the second conductive layer, arranged in correspondence of areas of the second elastic layer which are free from rails which form the third elastic layer, wherein each second conductive track is connected to a second contact pad made in the central portion of the flexible membrane and adapted to contact a micro contact probe for carrying high-frequency non-power signals, that signals with a frequency of more than 1 GHz and a power of less than 35 dBm, and wherein the first conductive tracks, the second conductive tracks and the ground conductive tracks are further connected to conductive portions made in the peripheral portion of the flexible membrane.

27. The flexible membrane of claim 20, wherein the first elastic layer, the second elastic layer and the third elastic layer have respective first thickness, second thickness and third thickness of between 10 µm and 30 µm and the final elastic layer has a fourth thickness of between 5 µm and 15 µm, the first conductive layer, the second conductive layer and the third conductive layer have thicknesses of between 10 µm and 15 µm, and the first area has a first total thickness of between 40 µm and 50 µm and the second area has a second total thickness having values between 70 µm and 125 µm.

28. The flexible membrane of claim 20, further comprising first conductive tracks which comprise a first portion formed by a conductive trace made in the second conductive layer and a second portion formed by a conductive trace having a greater width made in the third conductive layer, wherein each first conductive track is connected to a first contact pad made in the central portion of the flexible membrane and adapted to contact a micro contact probe for carrying high-frequency power signals, that signals with a frequency of more than 1 GHz and a power of more than 35 dBm, and the first conductive tracks are made in the rails.

29. The flexible membrane of claim 28, further comprising ground lines made by means of ground conductive tracks which comprise a first portion formed by a trace made in the second conductive layer, and a second portion formed by a trace made in the first conductive layer;

wherein the first and second portions are interconnected by means of first conductive structures, each ground conductive track is connected to a ground pad made in the central portion of the flexible membrane, the ground conductive tracks are made in correspondence of the first conductive tracks in the rails and further comprise a third portion formed by a trace made in the third conductive layer, and further conductive structures, the third portion being interconnected to the first portion formed by a trace made in the second conductive layer by means of the further conductive structures.

30. A probe card for testing electronic devices, comprising:
a support plate having a plurality of contact pads;
a flexible membrane having a first face and comprising a plurality of conductive tracks; and
a plurality of micro contact probes associated with the first face of the flexible membrane,
the micro contact probes being adapted to abut onto a plurality of contact pads of a device under test and being electrically coupled to the plurality of conductive tracks made in the flexible membrane and electrically connected with the contact pads of the support plate,
wherein the flexible membrane comprises: a central portion provided with a plurality of contact pads; a peripheral portion provided with a plurality of contact structures; and an intermediate portion arranged and connected between the central portion and the peripheral portion; the plurality of contact pads are adapted to electrically connect the plurality of micro contact probes and the plurality of contact structures being adapted to electrically connect the support plate, each of the conductive tracks being adapted to electrically connect one of the contact pads with one of the contact structures, the flexible membrane being divided into a first area having a first total thickness and into a second area having a second total thickness, the first area is contiguous and adjacent to the second area, and the first total thickness is less than or equal to 75 μm and the second total thickness is greater than the first total thickness, the first area of the flexible membrane extending in correspondence of the central portion and comprising the plurality of contact pads.

31. The probe card of claim 30, further comprising a plurality of micro contact probes having a height of less than 200 μm.

32. The probe card of claim 30, further comprising a damping structure interposed between the flexible membrane and the support plate.

33. The probe card of claim 32, wherein the damping structure comprises a plurality of preloading probes adapted to abut onto the flexible membrane at the central portion thereof.

* * * * *